United States Patent [19]
Ishikawa

[11] Patent Number: 5,691,673
[45] Date of Patent: Nov. 25, 1997

[54] SEMICONDUCTOR INTEGRATED CIRCUIT APPARATUS HAVING INPUT/OUTPUT PORTIONS IMPEDANCE-MATCHED FOR TRANSMISSION LINES

[75] Inventor: Toru Ishikawa, Tokyo, Japan

[73] Assignee: NEC Corporation, Tokyo, Japan

[21] Appl. No.: 665,757

[22] Filed: Jun. 17, 1996

[30] Foreign Application Priority Data

Jun. 15, 1995  [JP]  Japan ................................. 7-171657

[51] Int. Cl.$^6$ ................................................ H01P 5/00
[52] U.S. Cl. ...................... 333/33; 257/664; 333/247
[58] Field of Search ................. 333/33, 247; 257/664, 257/728; 439/68, 70

[56]  References Cited

U.S. PATENT DOCUMENTS

| | | | |
|---|---|---|---|
| 4,626,805 | 12/1986 | Jones | 333/33 |
| 5,133,676 | 7/1992 | Hutchison et al. | 333/33 X |
| 5,162,896 | 11/1992 | Takubo et al. | 257/664 |
| 5,334,962 | 8/1994 | Higgins et al. | 333/247 |
| 5,376,909 | 12/1994 | Nelson et al. | 333/33 X |

FOREIGN PATENT DOCUMENTS

| | | |
|---|---|---|
| 61-251059 | 11/1986 | Japan . |
| 62-296611 | 12/1987 | Japan . |
| 91/16680 | 10/1991 | WIPO . |

*Primary Examiner*—Paul Gensler
*Attorney, Agent, or Firm*—Foley & Lardner

[57]  ABSTRACT

In a semiconductor integrated circuit apparatus, a semiconductor chip (device, or module) has input/output portions each connected to two external pins (or terminals). The two external pins are connected to an incoming transmission line and an outgoing transmission line, respectively. The following formula is satisfied:

$$Z = \sqrt{(L1 + L2)/C1}$$

where Z is an impedance of each of the transmission lines; L1 and L2 are inductances of the two pins; and C1 is a capacitance of each of the input/output portions.

19 Claims, 20 Drawing Sheets

$$Z_6 = \sqrt{(L1'+L2')/(C1'+C3'+C4')}$$

$$Z_7 = \sqrt{(L1'' + L2'')/(C1'' + C3'' + C4'')}$$

5,691,673

SEMICONDUCTOR INTEGRATED CIRCUIT APPARATUS HAVING INPUT/OUTPUT PORTIONS IMPEDANCE-MATCHED FOR TRANSMISSION LINES

BACKGROUND OF THE INVENTION

1. Field of the Invention

The present invention relates to a semiconductor integrated circuit apparatus, and more particularly, to a semiconductor integrated circuit apparatus having input/output portions impedance-matched for transmission lines.

2. Description of the Related Art

Generally, in a semiconductor integrated circuit apparatus, a semiconductor chip (device or module) includes input/output portions each connected to a single external pin (or terminal). The single external pin is connected to an incoming transmission line and an outgoing transmission line. Note that the transmission lines are conventionally formed by microstrip lines formed on a printed board (hereinafter, simply referred to as "board").

In order to obtain impedance matching between the transmission lines and the external pins, a capacitance of each external pin is introduced into the impedance of each of the respective transmission lines, so that the combination impedance is uniform (see: WO 91/16680 (U.S. patent application Ser. No. 07/510,898, filed Apr. 18, 1990, now abandoned).

In the above-described prior art, however, since an inductance is present between the external pin and the input/output portion, it is impossible to obtain a complete impedance matching between the transmission lines and the input/output portions of the semiconductor chip (device or module). This will be explained later in detail.

Note that, if each of the input/output portions is connected to a single transmission line, it is possible to obtain a complete impedance matching between the transmission line and each of the input/output portions by adjusting a capacitance of a compensation capacitor introduced into each of the input/output portions or the like (see: JP-A-61-251059, corresponding to U.S. Pat. No 4,626,805). Also, it is possible to enhance the signal characteristics by connecting a terminating resistor to each of the input/output portions (see: JP-A-62-296611). However, if such technology is applied to a semiconductor integrated circuit apparatus where each of the input/output portions of the semiconductor chip (device or module) is connected to two transmission lines, i.e., an incoming transmission line and an outgoing transmission line, there occurs an impedance mismatching, thus deteriorating the signal characteristics. This will also be explained later in detail.

SUMMARY OF THE INVENTION

It is an object of the present invention to obtain a complete impedance matching between transmission lines and input/output portions in a semiconductor integrated circuit apparatus.

According to the present invention, in a semiconductor integrated circuit apparatus, a semiconductor chip (device or module) has input/output portions each connected to two external pins (or terminals). The two external pins are connected to an incoming transmission line and an outgoing transmission line, respectively. The following formula is satisfied:

$$Z = \sqrt{(L1+L2)/C1}$$

where Z is an impedance of each of the transmission lines) L1 and L2 are inductances of the two pins; and C1 is a capacitance of each of the input/output portions. Thus, since the inductance of each of the pins can be introduced into the transmission lines, these inductances can be compensated for, to obtain a complete impedance matching.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, prior art semiconductor integrated circuit apparatuses will be explained with reference to FIGS. 1, 2A, 2B, 2C, 3, 4A, 4B, 5A, 5B, 6A, 6B, 7, 8 and 9.

Figure 1:
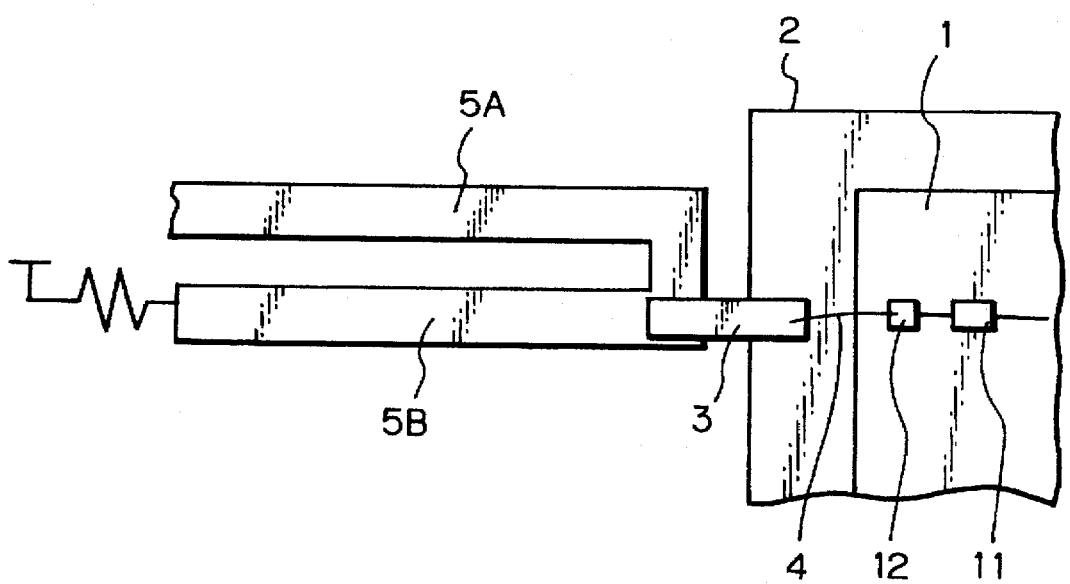
FIG. 1 is a plan view illustrating a first prior art semiconductor integrated circuit apparatus.

In FIG. 1, which illustrates a first prior art semiconductor integrated circuit apparatus, reference numeral 1 designates a semiconductor chip mounted on a package 2. The semiconductor chip 1 includes an input/output circuit 11 connected to a single pad 12. Also, an external pin 3 is mounted on the package 2, and is connected to the pad 12 by a bonding wire 4. The external pin 3 is connected to an incoming transmission line 5A and an outgoing transmission line 5B which are formed by microstrip lines.

Figure 2A:
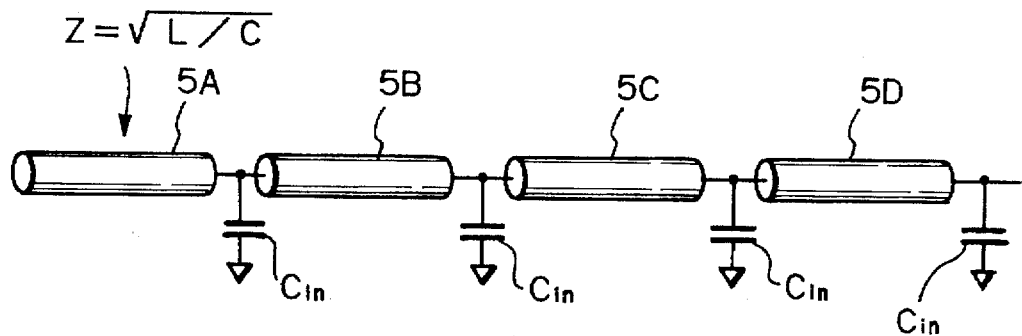
FIGS. 2A, 2B, 2C, 3, 4A, 4B, 5A, 5B and 6A are equivalent circuit diagrams of the apparatus of FIG. 1.
Figure 2B:
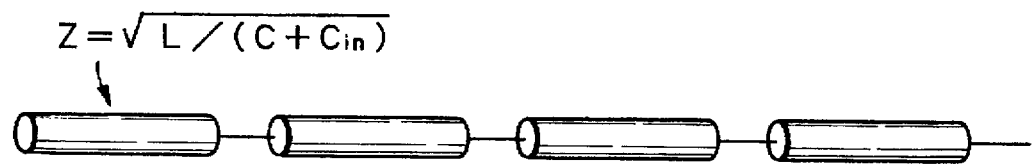

In FIG. 2A, which is an equivalent circuit diagram of a plurality of semiconductor chips (packages) of FIG. 1 connected in series, the impedance Z of each of the transmission lines 5A, 5B, 5C, 5D, . . . is required to match the external pin 3. In FIG. 2A, $C_{in}$ is a capacitance of the external pin 3. Therefore, as illustrated in FIG. 2B, an impedance matching is possible by introducing the capacitance $C_{in}$ into the impedance of each of the transmission lines 5A, 5B, 5C, 5D, . . . (see: WO 91/16680 (U.S. patent application Ser. No. 07/510,898, filed Apr. 18, 1990, now abandoned). In this case, a transmission impedance can be represented by $$Z = \sqrt{L/(C+C_{in})} \quad (1)$$

where L is an inductance of each of the transmission lines 5A, 5B, 5C, 5D, . . . ; and C is a capacitance of each of the transmission lines 5A, 5B, 5C, 5D, . . . .

Figure 2C:
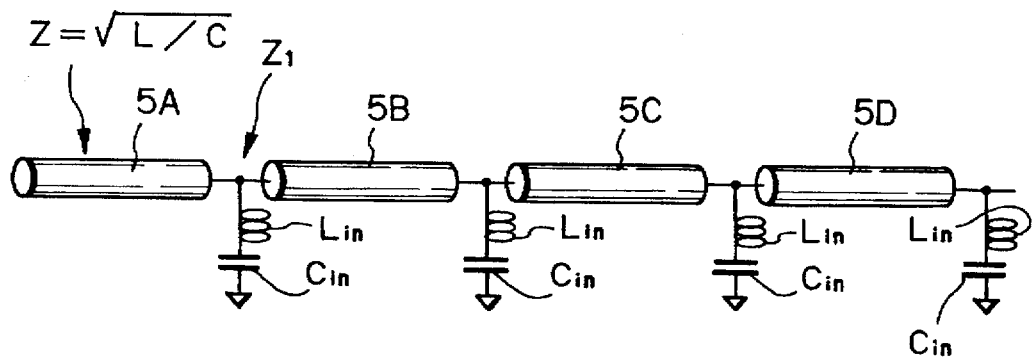

However, there is an inductance $L_{in}$ of the package 2 in the apparatus of FIG. 1, and therefore, the equivalent circuit diagram of FIG. 2A is actually illustrated in FIG. 2C, which creates an impedance mismatching.

Figure 3:
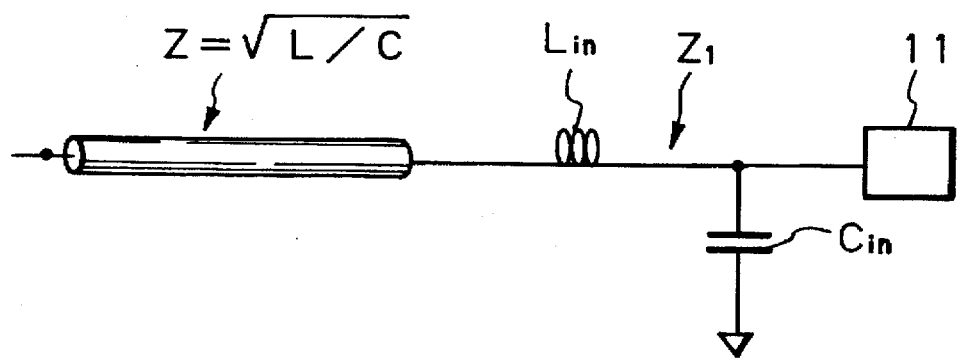

If only one semiconductor chip (package) is connected to a single transmission line whose impedance is Z as illustrated in FIG. 3, an impedance $Z_1$ formed by the capacitance $C_{in}$ and the inductance $L_{in}$ is not always equal to the impedance Z of the transmission line, i.e., $$Z_1 \neq Z$$

Therefore, an impedance mismatching is generated.

Figure 4A:
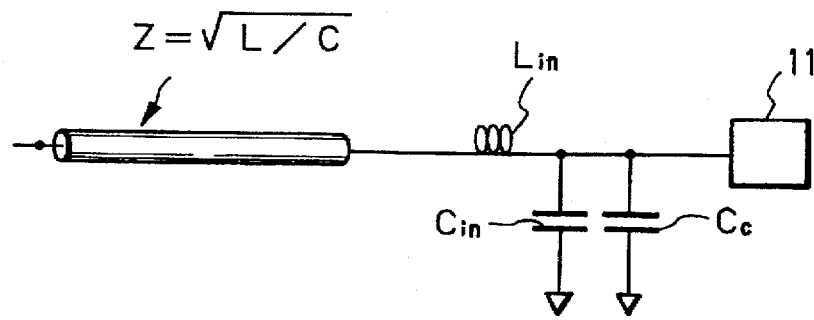

In order to obtain an impedance matching in the circuit of FIG. 3, a compensation capacitor whose capacitance is $C_0$ is connected to the external pin 3 as illustrated in FIG. 4A (see: JP-A-61-251059, corresponding to U.S. Pat. No. 4,626,805). In this case, the value of the capacitance $C_c$ is adjusted to satisfy the following:

$$Z = \sqrt{L_{in}/(C_{in}+C_c)} \quad (2)$$

Figure 4B:
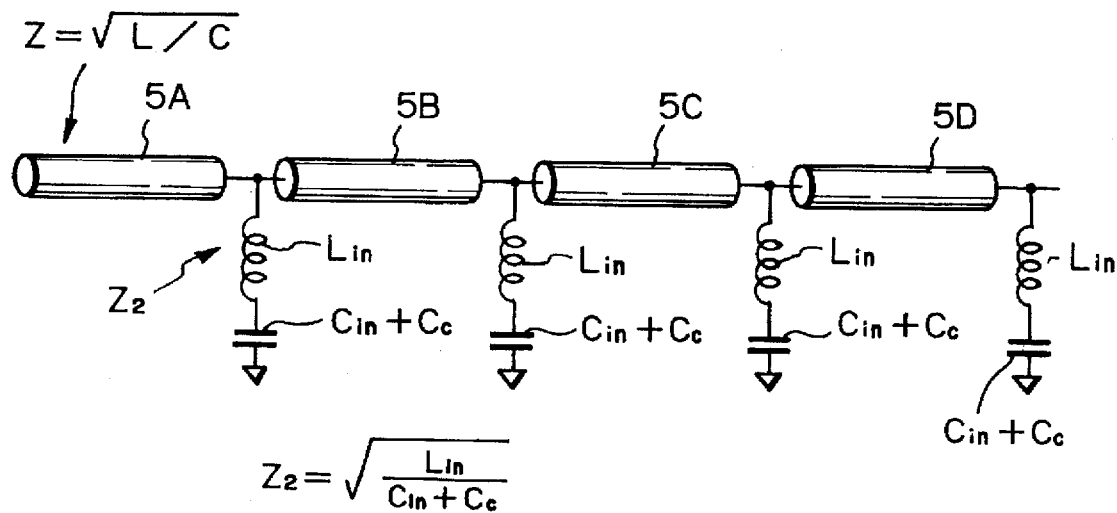

However, if the technology as illustrated in the equivalent circuit diagram of FIG. 4A is applied to a plurality of semiconductor chips (packages), an impedance mismatching is generated as illustrated in FIG. 4B. That is, even when an impedance $Z_2$ formed by the inductance $L_{in}$ and the capacitance ($C_{in}+C_c$) is adjusted to be equal to the impedance Z of the transmission line, i.e., $Z_2=Z$, an impedance in view of the transmission line 5A to the downstream side is a combination of the impedance $Z_2$ and the impedance of the transmission line 5B, i.e., $Z_2+Z=Z/2$. Therefore, the combination impedance Z/2 is mismatched with the impedance Z of the transmission line 5A. Also, since the inductance $L_{in}$ is not terminated, signals reflected from the capacitance ($C_{in}+C_c$) deteriorate the signal characteristics on the transmission lines 5A, 5B, 5C, 5D. The signal characteristics are further deteriorated by the total reflection at the external pins 5.

Figure 5A:
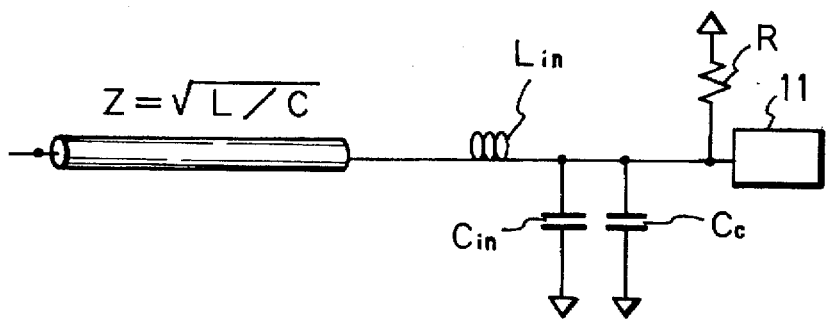

Also, as illustrated in FIG. 5A, a terminal resistor R is connected within the semiconductor chip 1 to absorb the signal on the transmission line (see: JP-A-62-296611).

Figure 5B:
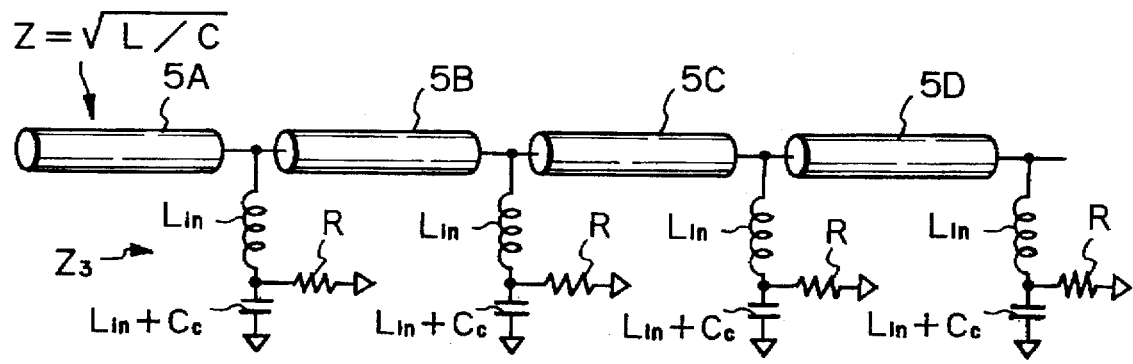

However, if the technology as illustrated in the equivalent circuit diagram of FIG. 5A is applied to a plurality of semiconductor chips (packages), an impedance mismatching is generated as illustrated in FIG. 5B. That is, the inductance $L_{in}$ is terminated by the resistor R, and the reflection of signals from the capacitor ($C_{in}+C_c$) hardly occurs. However, even if $Z=Z_3=R$, the combination impedance Z/2 is still mismatched with the impedance Z of the transmission line 5A.

Figure 6A:
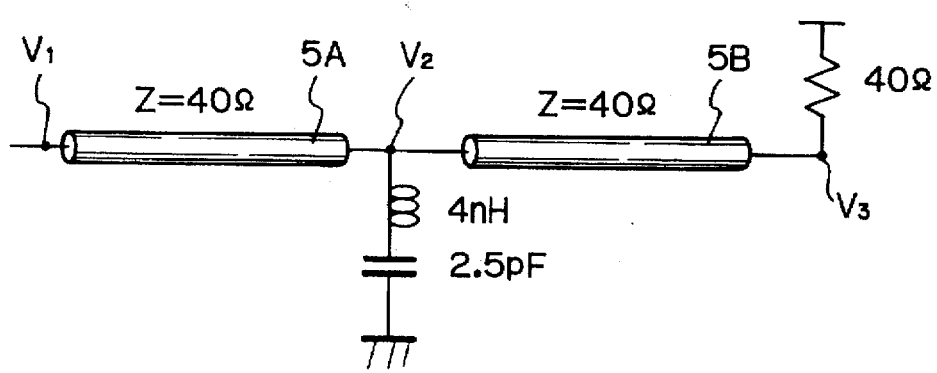
Figure 6B:
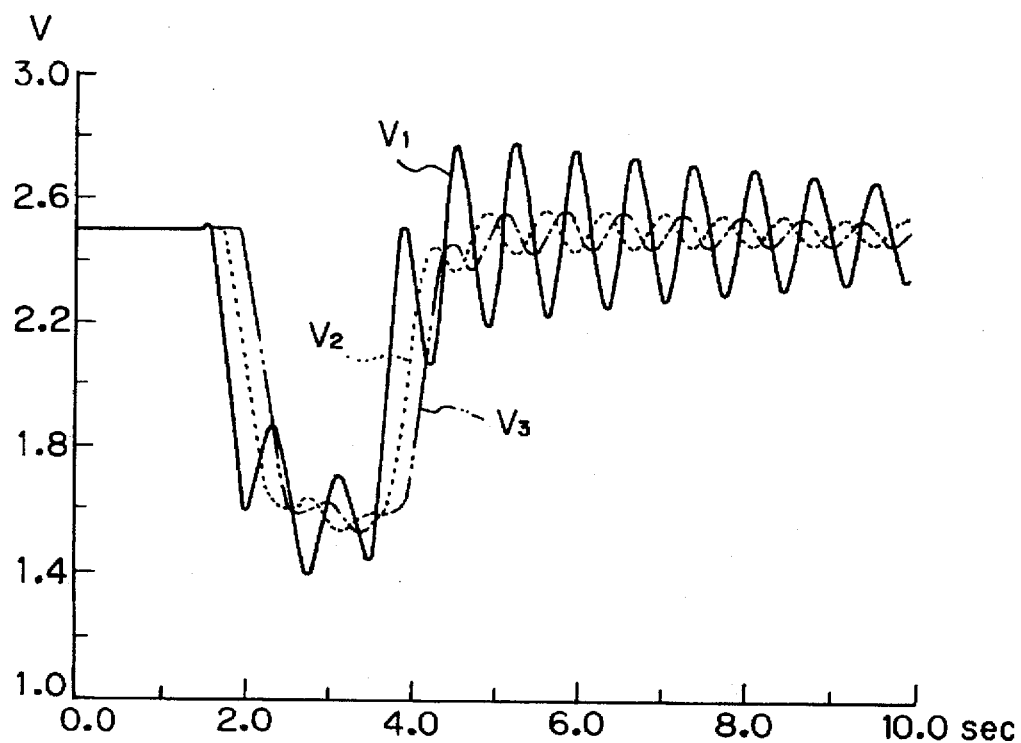
FIG. 6B is a timing diagram for showing a simulation result of the circuit of FIG. 6A.

In the circuit of FIG. 2C, if the impedance Z of the transmission line is 40 Ω, the capacitance $C_{in}$ is 2.5 pF, and the inductance $L_{in}$ is 4 nH, as shown in FIG. 6A, voltages $V_1$, $V_2$ and $V_3$ are simulated as shown in FIG. 6B, which shows that the characteristics of the voltages $V_1$, $V_2$ and $V_3$ are remarkably deteriorated, since an impedance mismatching is generated.

Figure 7:
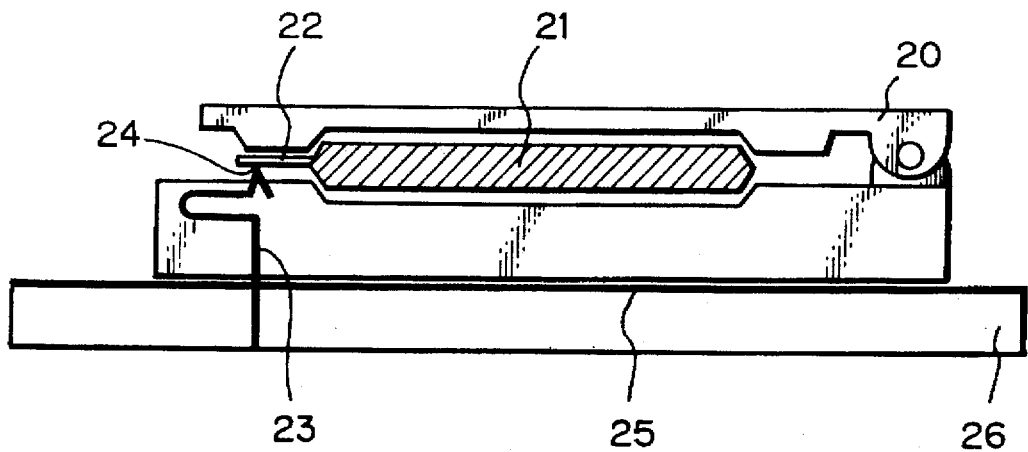
FIG. 7 is a side view illustrating a second prior art semiconductor integrated circuit apparatus.

FIG. 7 is a side view illustrating a second prior art semiconductor integrated circuit apparatus which is of a socket type. In FIG. 7, a device 21 is connected to an external pin 22 of a case 20. The external pin 22 is in contact with a mounting terminal 23 via a contact terminal 24. The mounting terminal 23 is connected to a transmission line (microstrip line) 25 mounted on a board 26.

Figure 8:
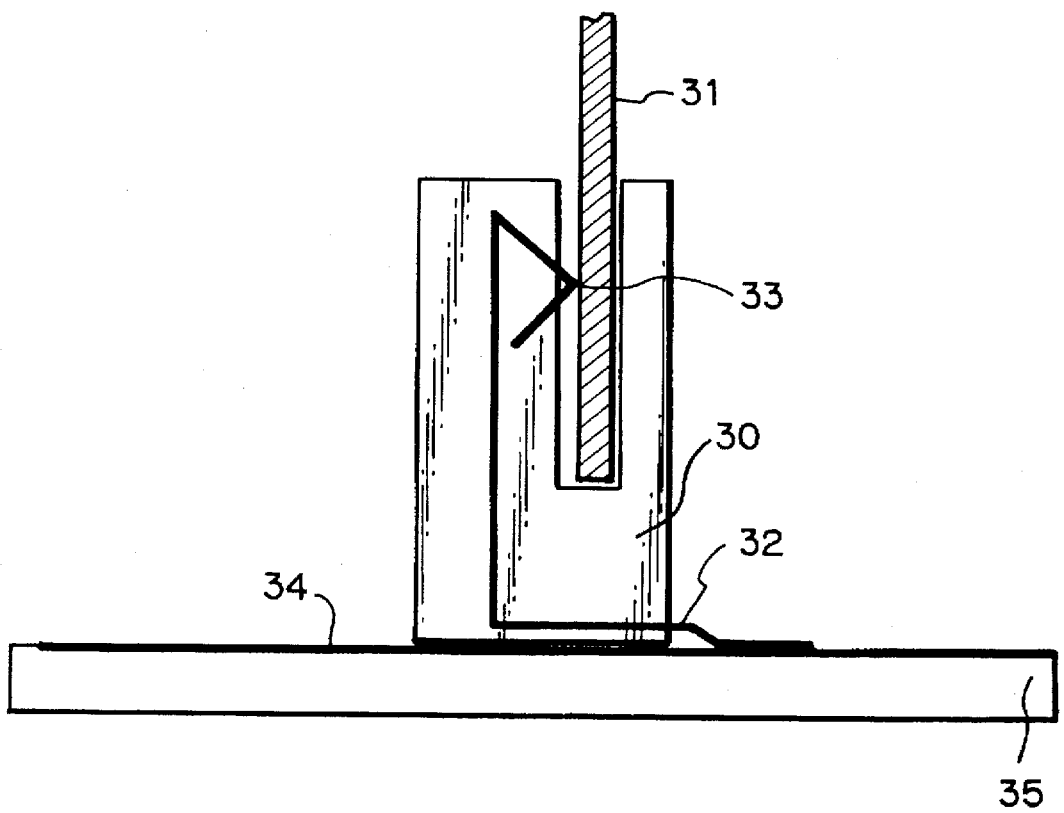
FIG. 8 is a side view illustrating a third prior art semiconductor integrated circuit apparatus.
Figure 9:
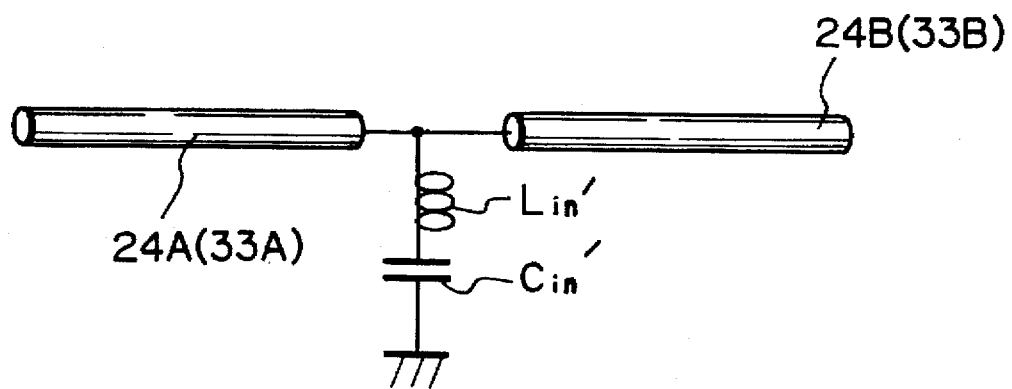
FIG. 9 is an equivalent circuit diagram of the apparatuses of FIGS. 7 and 8.

FIG. 8 is a side view illustrating a third prior art semiconductor integrated circuit apparatus which is also of a socket type. In FIG. 8, a module 31 is in contact with to a mounting terminal 32 via a contact terminal 33 supported by a base 30. The mounting terminal 32 is connected to a transmission line (microstrip line) 34 mounted on a board Even in FIGS. 7 and 8, there are a capacitance $C_{in}'$ of the socket and an inductance $L_{in}'$ of the socket as illustrated in FIG. 9. Therefore, when a plurality of sockets are connected in series, an impedance mismatching is generated, thus deteriorating the signal characteristics.

Figure 10A:
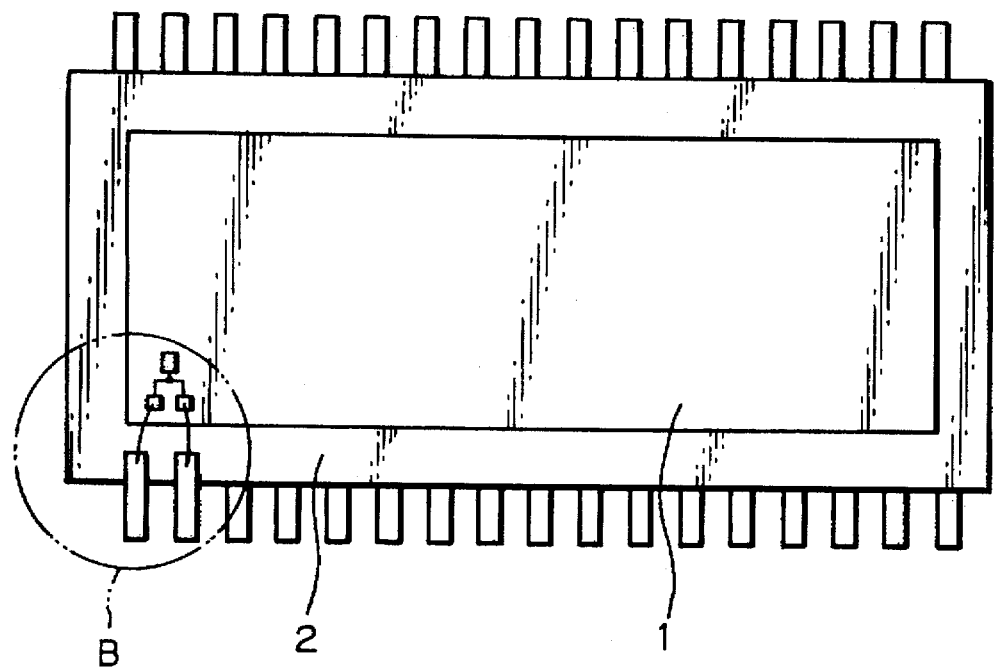
FIG. 10A is a plan view illustrating a first embodiment of the semiconductor integrated circuit apparatus according to the present invention.
Figure 10B:
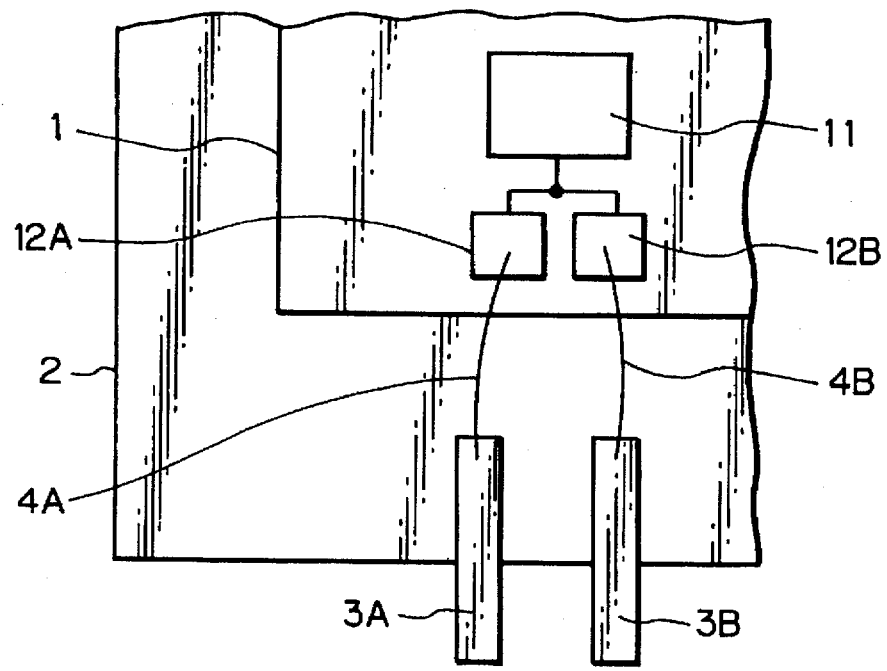
FIG. 10B is a detailed plan view of the apparatus of FIG. 10A.

FIG. 10A is a plan view illustrating a first embodiment of the semiconductor integrated circuit apparatus according to the present invention, and FIG. 10B is a detailed plan view of a portion indicated by B in FIG. 10A. That is, the input/output circuit 11 is connected to two pads 12A and 12B which are connected to external pins 3A and 3B, respectively, by bonding wires 4A and 4B.

Figure 11:
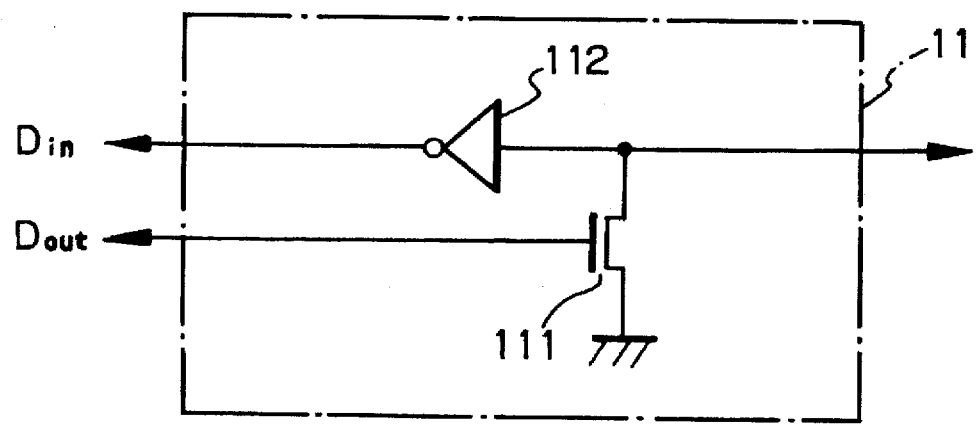
FIG. 11 is a circuit diagram of the input/output circuit of FIGS. 10A and 10B.

In FIG. 11, which is a detailed circuit diagram of the input/output circuit 11 of FIGS. 10A and 10B, the input/output circuit 11 is comprised of a MOS transistor 111 controlled by an output signal $D_{out}$ and an inverter 112 for generating an input signal $D_{in}$.

Figure 12A:
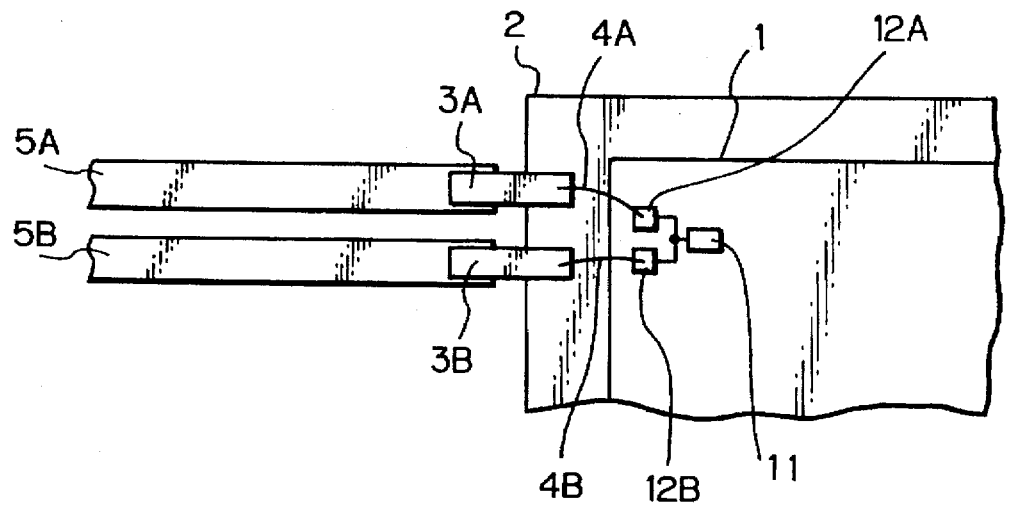
FIG. 12A is a plan view illustrating a state where the apparatus of FIGS. 10A and 10B is connected to transmission lines.
Figure 12B:
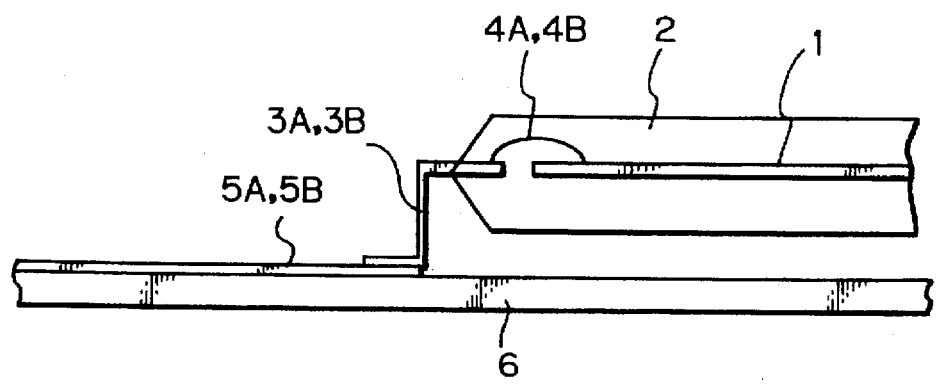
FIG. 12B is a side view of the apparatus of FIG. 12A.

FIG. 12A is a plan view illustrating a state where the apparatus of FIGS. 10A and 10B is connected to the transmission lines 5A and 5B, and FIG. 12B is a side view of FIG. 12A. That is, the external pins 3A and 3B are adhered to the transmission lines (microstrip lines) 5 by soldering.

Figure 13A:
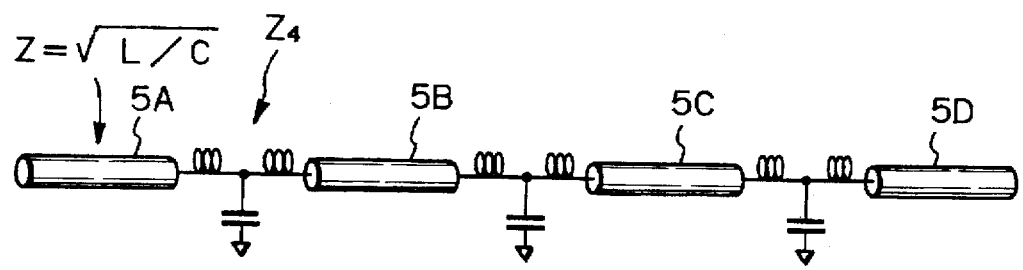
FIGS. 13A, 13B and 13C are equivalent circuit diagrams of the apparatus of FIGS. 12A and 12B.
Figure 13B:
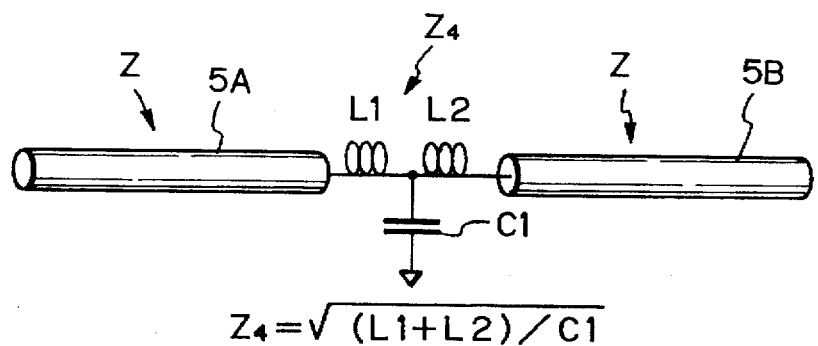

FIG. 13A is an equivalent circuit diagram of a plurality of semiconductor chips (packages) of FIGS. 12A and 12B connected in series, and FIG. 13B is a partial equivalent circuit diagram of the circuit of FIG. 13A. Therefore, an impedance $Z_4$ between the transmission lines is represented by $$Z_4 = \sqrt{(L1+L2)/C1} \quad (3)$$

where L1 is an inductance of the external pin 3A and the bonding wire 4A;

L2 is an inductance of the external pin 3B and the bonding wire 4B; and

C1 is a capacitance of the pads 12A and 12B.

Figure 13C:
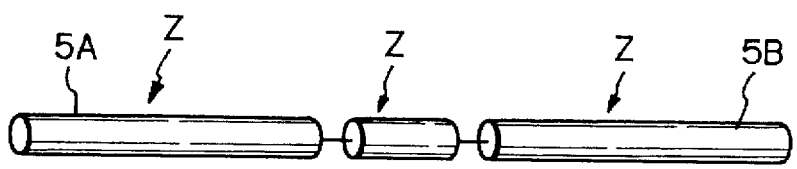

Therefore, if $Z_4=Z$, the equivalent circuit diagram of FIG. 13B is replaced by an equivalent circuit diagram of FIG. 13C. For example, the impedance Z of each of the transmission lines 5A, 5B, ... is adjusted to satisfy the formula $Z_4=Z$.

Figure 14:
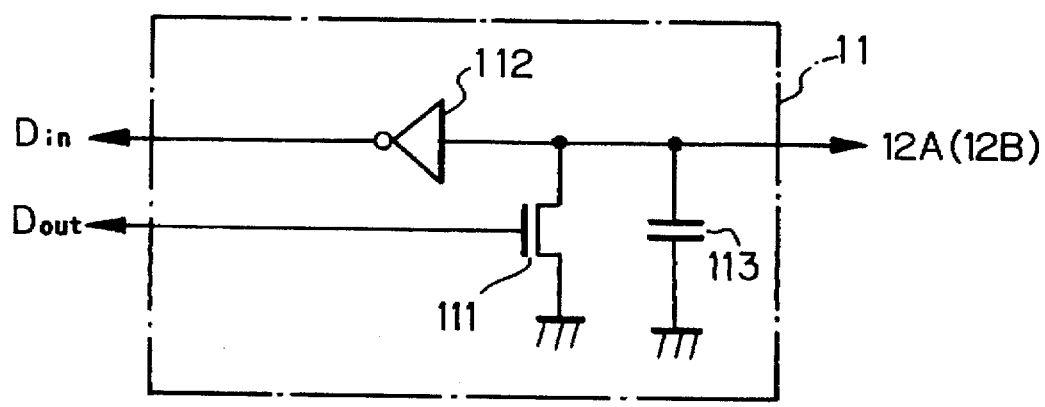
FIG. 14 is a circuit diagram illustrating a modification of the circuit of FIG. 11.

In FIG. 14, which is a modification of the input/output circuit 11 of FIG. 11, a compensation capacitor 113 is added to the elements of FIG. 11. In this case, the formula (3) is replaced by $$Z_4 = \sqrt{(L1+L2)/(C1+C2)} \tag{4}$$

where C2 is a capacitance of the compensation capacitor 113. In this case, the capacitance C2 of the compensation capacitor 113 is adjusted to satisfy the formula $Z=Z_4$. Therefore, the equivalent circuit diagram of FIG. 13C is also realized.

Figure 15A:
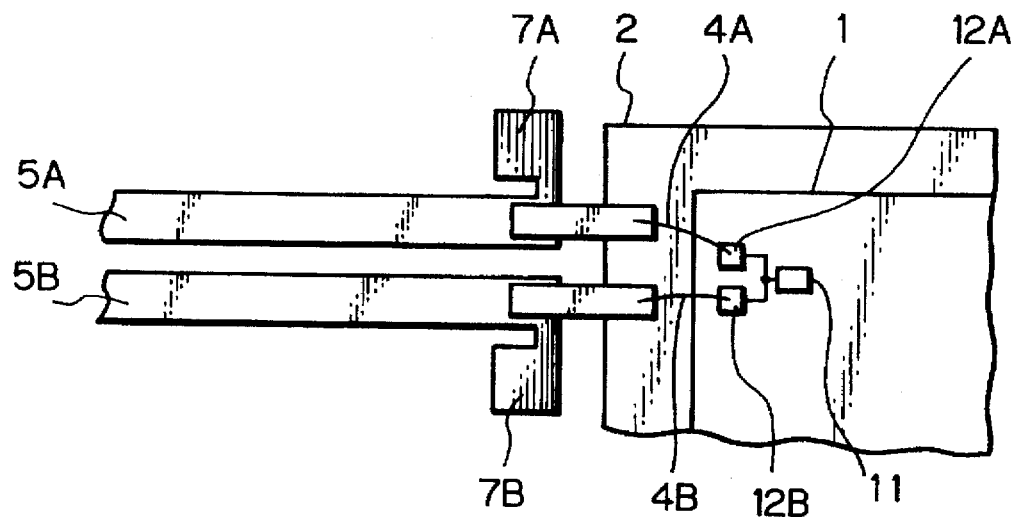
FIG. 15A is a plan view illustrating a second embodiment of the semiconductor integrated circuit apparatus according to the present invention.
Figure 15B:
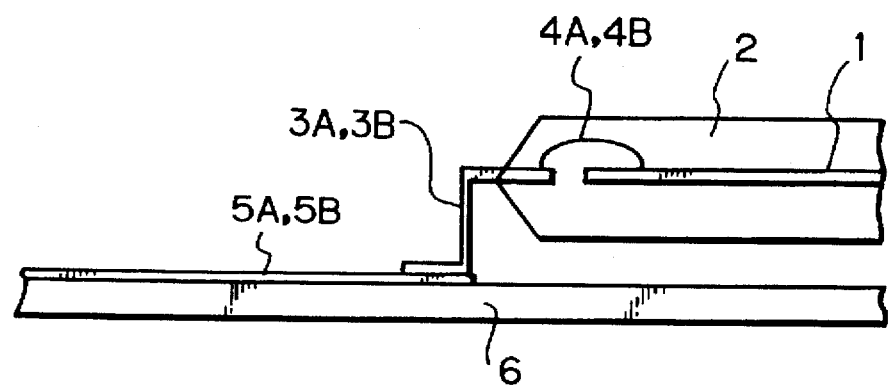
FIG. 15B is a side view of the apparatus of FIG. 15A.

FIG. 15A is a plan view illustrating a second embodiment the semiconductor integrated circuit apparatus according to the present invention, and FIG. 15B is a side view of FIG. 15A. In FIGS. 15A and 15B, compensation capacitors 7A and 7B are formed on the board 6 and are connected to the transmission lines 5A and 5B, respectively. Note that the compensation capacitors 7A and 7B can be formed on a rear surface of the board 6, within throughholes of the board 6, or an internal layer of a multilayer type board.

Figure 16A:
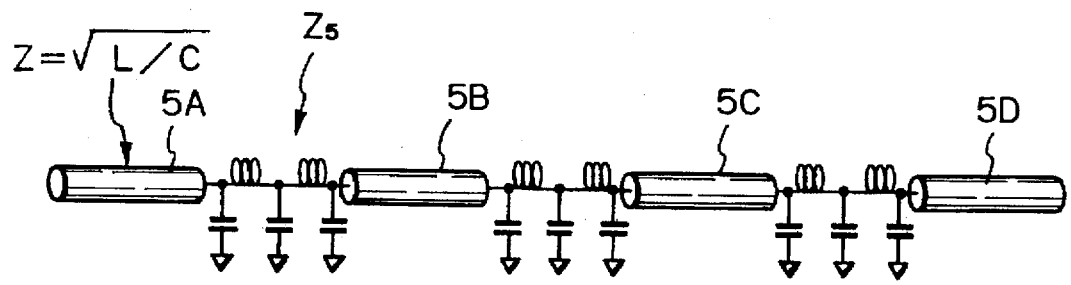
FIGS. 16A, 16B, 16C, 17A, 17B, 17C and 18A are equivalent circuit diagrams of the apparatus of FIGS. 15A and 15B.
Figure 16B:
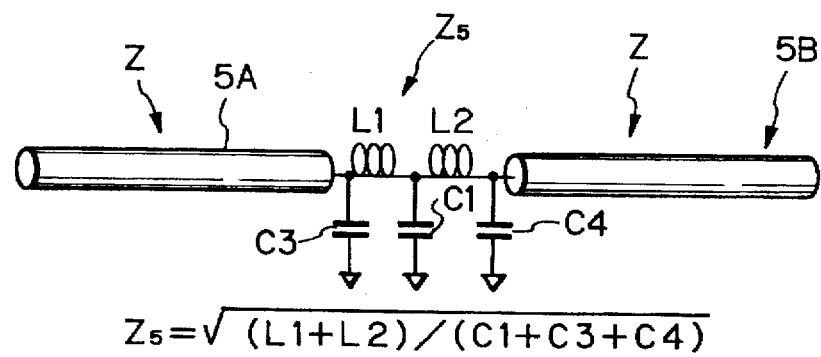

FIG. 16A is an equivalent circuit diagram of a plurality of semiconductor chips (packages) of FIGS. 15A and 15B connected in series, and FIG. 16B is a partial equivalent circuit diagram of the circuit of FIG. 16A. Therefore, an impedance $Z_5$ between the transmission lines is represented by $$Z_5 = \sqrt{(L1+L2)/(C1+C3+C4)} \tag{5}$$

where C3 and C4 are capacitances of the compensation capacitors 7A and 7B, respectively. In this case, the capacitances C3 and C4 of the compensation capacitors 7A and 7B are adjusted to satisfy the formula $Z=Z_5$. Therefore, an equivalent circuit diagram of FIG. 16 C is realized.

Note that, if the external pin 3A has the same configuration as the external pin 3B and the bonding wire 4A has the same configuration as the bonding wire 4B, L1=L2=L. In this case, the formulae (3), (4) and (5) can be replaced by $$Z_4 = \sqrt{2L/C1} \tag{3}'$$

$$Z_4 = \sqrt{2L/(C1+C2)} \tag{4}'$$

$$Z_5 = \sqrt{2L/(C1+C3+C4)} \tag{5}'$$

In addition, if the compensation capacitor 7A has the same configuration as the compensation capacitor 7B, C3=C4=C0. Then the formula (5)' can be replaced by $$Z_5 = \sqrt{2L/(C1+2C0)} \tag{5}''$$

Figure 16C:
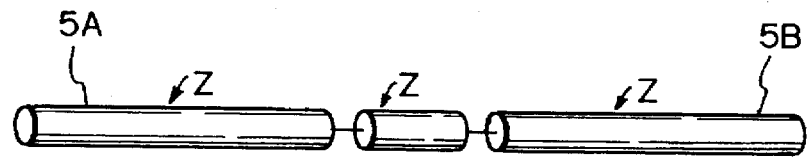

Thus, if $Z_5=Z$, an equivalent circuit diagram of FIG. 16C is realized. In this case, if a propagation direction of signals on the transmission lines is reversed, the same characteristics of signals can be expected.

Figure 17A:
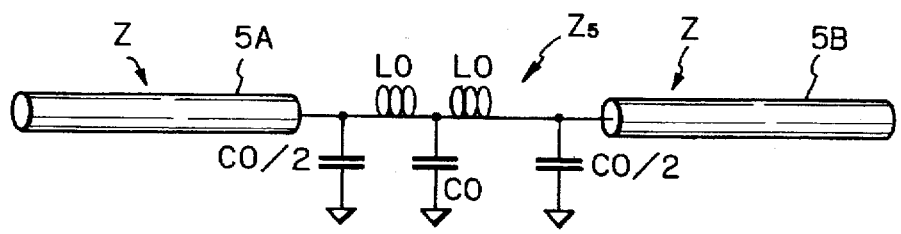
Figure 17B:
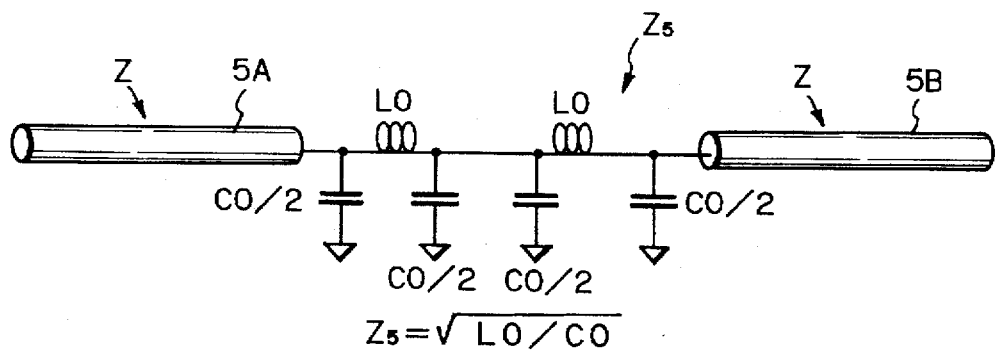

Further, in FIG. 16B, if L1=L2=L0 and C3=C4=C1/2=C0/2, then, the equivalent circuit diagram of FIG. 16B is replaced by an equivalent circuit diagram of FIG. 17A which is also replaced by an equivalent circuit diagram of FIG. 17B, which shows a π model impedance. Therefore, the formula (5)" is replaced by $$Z_5 = \sqrt{L0/C0} \tag{5}'''$$

Figure 17C:
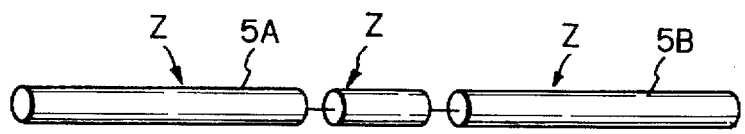
Figure 18A:
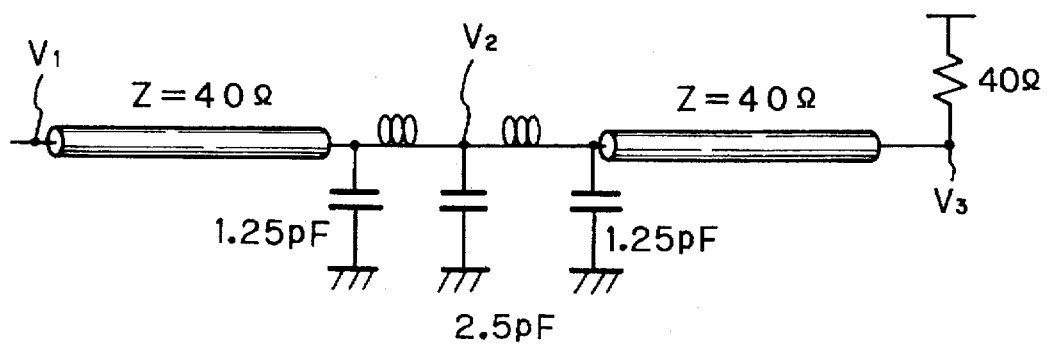
Figure 18B:
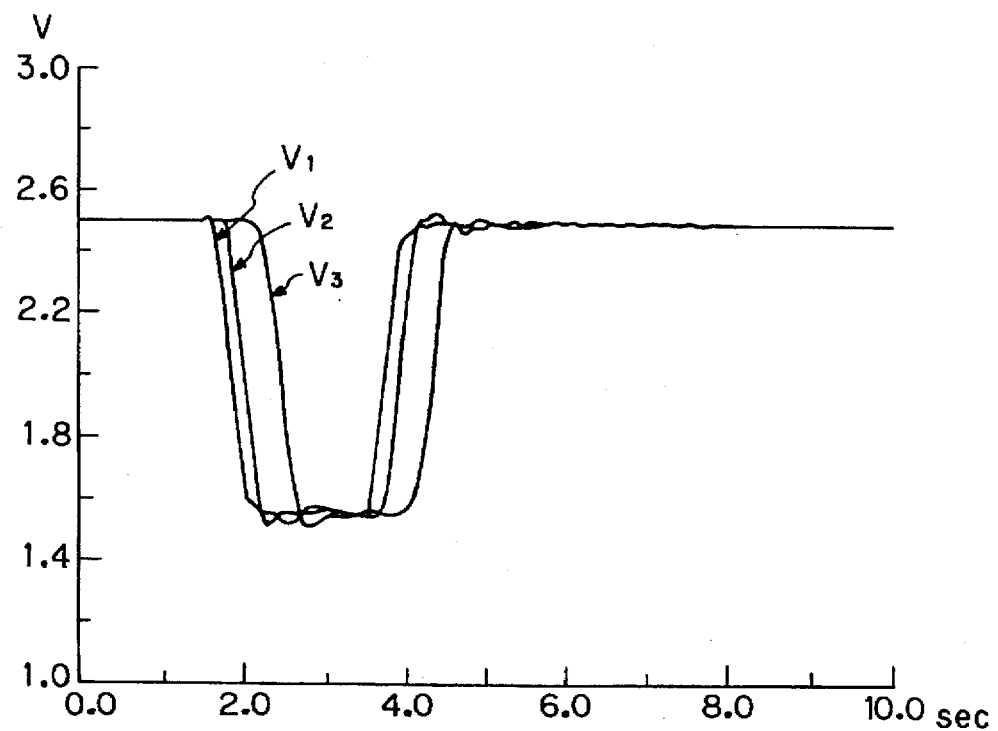
FIG. 18B is a timing diagram showing a simulation result of the circuit of FIG. 18A.

Thus, if $Z_5=Z$, an equivalent circuit diagram of FIG. 17C is realized. In the circuit of FIG. 17A, if the impedance Z of the transmission line is 40 Ω, the capacitance C0 is 2.5 pF, and the inductance L0 is 4 nH, as shown in FIG. 18A, voltages $V_1$, $V_2$ and $V_3$ are simulated as shown in FIG. 18B, which shows that the characteristics of the voltages $V_1$, $V_2$ and $V_3$ are remarkably improved, since an impedance is matched.

Figure 19A:
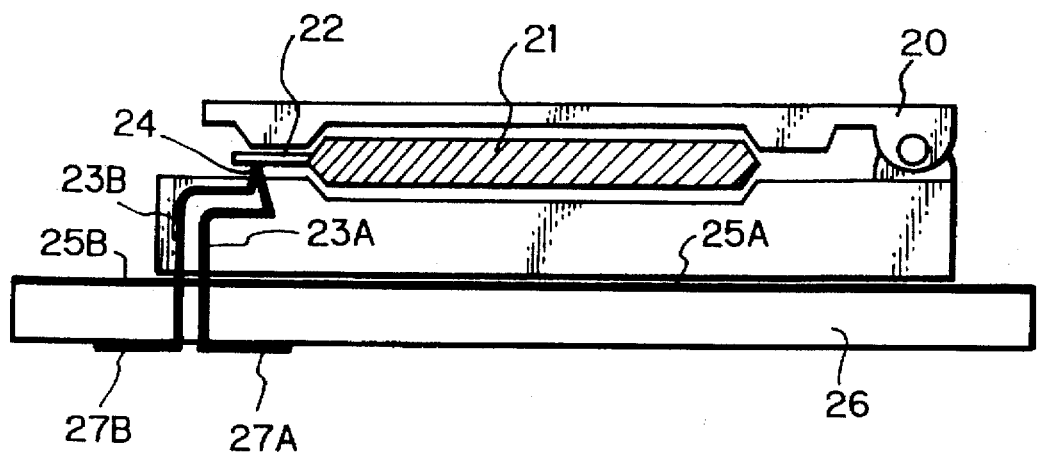
FIG. 19A is a side view illustrating a third embodiment of the semiconductor integrated circuit apparatus according to the present invention.
Figure 19B:
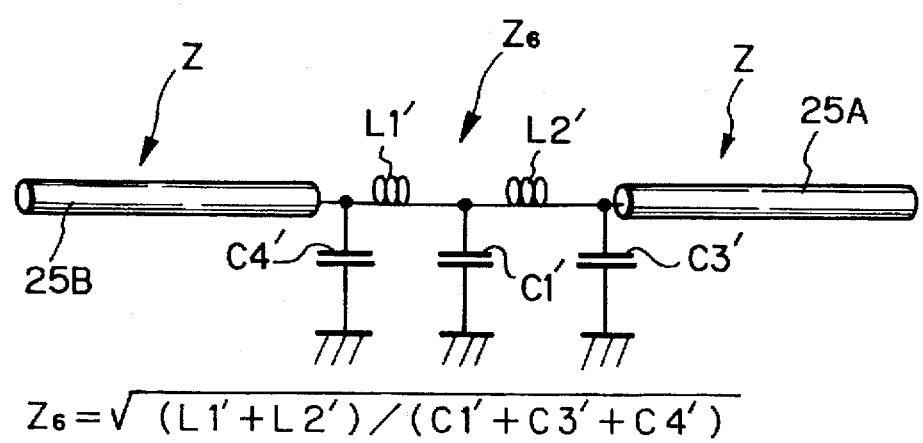
FIGS. 19B and 19C are equivalent circuit diagrams of the apparatus of FIG. 19A.

In FIG. 19A, which illustrates a third embodiment of the present intention, the external pin 22 of FIG. 7 is connected to two mounting terminals 23A and 23B at the contact terminal 24. The mounting terminals 23A and 23B are connected to transmission lines (microstrip lines) 25A and 25B, respectively. Also, the mounting terminals 23A and 23B are connected to compensation capacitors 27A and 27B, respectively, which are formed on a rear surface of the board 26. In this case, an equivalent circuit of the device of FIG. 19A is illustrated in FIG. 19B. Therefore, an impedance $Z_6$ between the transmission lines 25A and 25B is represented by $$Z_6 = \sqrt{(L1'+L2')/(C1'+C3'+C4')} \tag{6}$$

where L1' is an inductance of the mounting terminal 23A and the contact terminal 24;

L2' is an inductance of the mounting terminal 23B and the contact terminal 24;

C1' is a capacitance of the contact terminal 24 and the external pin 22; and

C3' and C4' are capacitances of the compensation capacitors 27A and 27B, respectively.

Figure 19C:
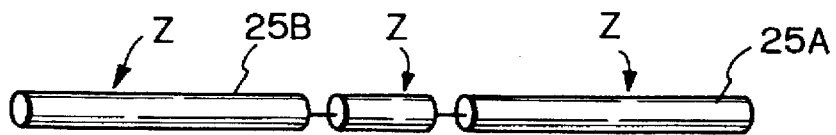

In this case, the capacitances C3' and C4' of the compensation capacitors 27A and 27B are adjusted to satisfy the formula $Z=Z_6$. Therefore, an equivalent circuit diagram of FIG. 19C is realized.

Note that, if the mounting terminal 23A has the same configuration as the mounting terminal 23B and the capacitor 27A has the same configuration as the capacitor 27B, the formula (6) is replaced by $$Z_6 = \sqrt{2L'/(C1'+2C0')} \tag{6}'$$

where L1'=L2'=L'
C3'=C4'=C0'

Further, if the compensation capacitors 27A and 27B are not present, and $$Z = \sqrt{(L1'+L2')/C1'}$$

is satisfied, a complete impedance matching can be obtained.

Figure 20A:
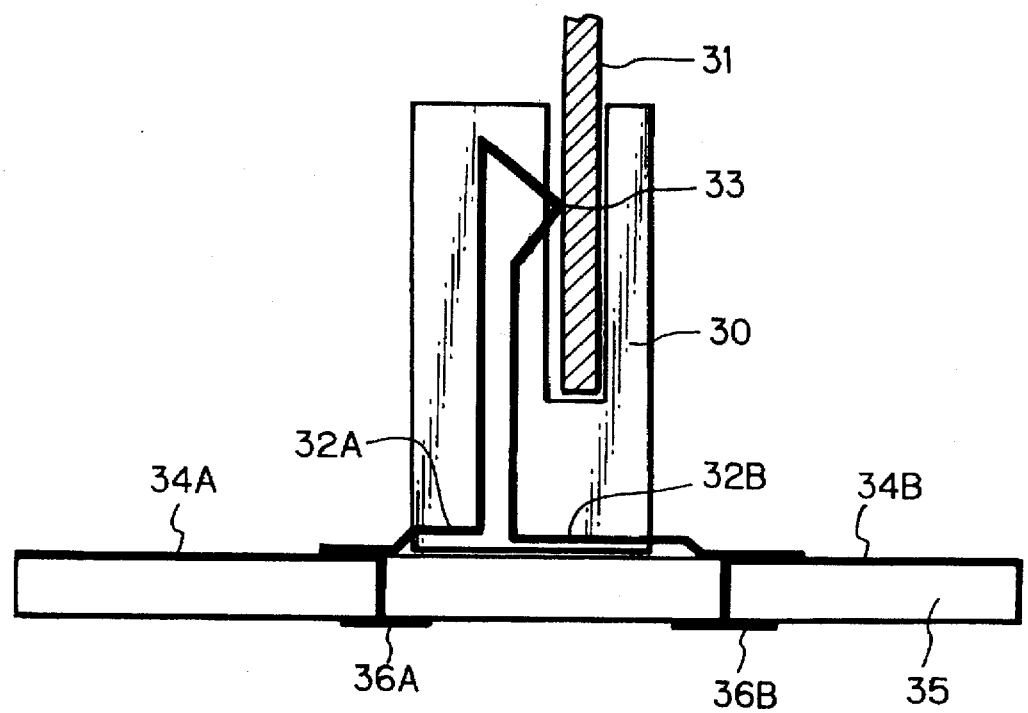
FIG. 20A is a side view illustrating a fourth embodiment of the semiconductor integrated circuit apparatus according to the present invention.
Figure 20B:
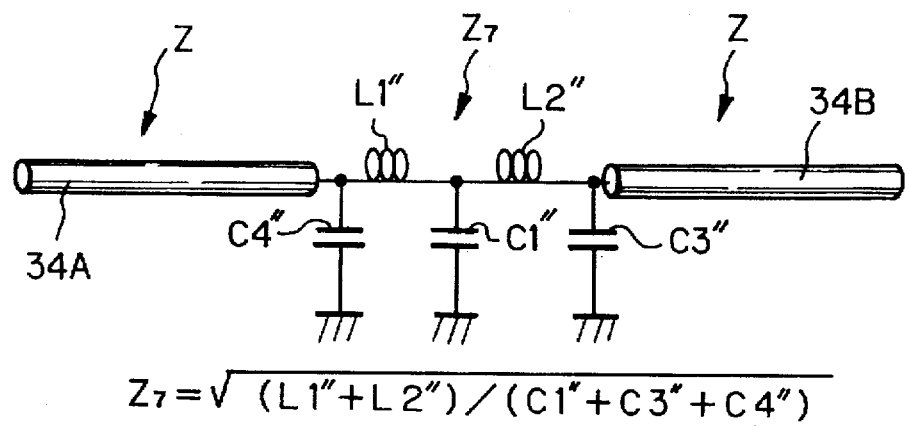
FIGS. 20B and 20C are equivalent circuit diagrams of the apparatus of FIG. 20A.

In FIG. 20A, which illustrates a fourth embodiment of the present invention, the contact terminal 33 of FIG. 8 is connected to two mounting terminals 32A and 32B. The mounting terminals 32A and 32B are connected to transmission lines (microstrip lines) 34A and 34B, respectively. Also, the mounting terminals 32A and 32B are connected to compensation capacitors 36A and 36B, respectively, which are formed on a rear surface of the board 35. In this case, an equivalent circuit of the device of FIG. 20A is illustrated in FIG. 20B. Therefore, an impedance $Z_7$ between the transmission lines 25A and 25B is represented by $$Z_7 = \sqrt{(L1''+L2'')/(C1''+C3''+C4'')} \quad (7)$$

where L1" is an inductance of the mounting terminal 32A and the contact terminal 33;

L2" is an inductance of the mounting terminal 32B and the contact terminal 33;

C1" is a capacitance of the contact terminal 33 and the module 31; and

C3" and C4" are capacitances of the compensation capacitors 36A and 36B, respectively.

Figure 20C:
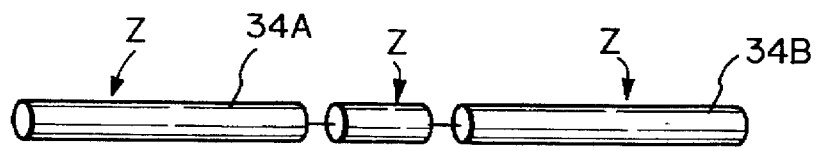

In this case, the capacitances C3" and C4" of the compensation capacitors 36A and 36B are adjusted to satisfy the formula $Z=Z_7$. Therefore, an equivalent circuit diagram of FIG. 20C is realized.

Note that, if the mounting terminal 32A has the same configuration as the mounting terminal 32B and the capacitor 36A has the same configuration as the capacitor 36B, the formula (7) is replaced by $$Z_7 = \sqrt{2L''/(C1''+2C0'')} \quad (7)''$$

where L1"=L2"=L"
C3"=C4"=C0"

Further, if the compensation capacitors 36A and 36B are not present, and $$Z = \sqrt{(L1''+L2'')/C1''}$$

is satisfied, a complete impedance matching can be obtained.

In FIG. 19A (20A), a compensation capacitor can be mounted within the device 21 (the module 31) instead the compensation capacitors 27A and 27B (36A and 36B).

As explained hereinabove, according to the present invention, since two terminals connected to two transmission lines are connected to an input/output portion of a semiconductor chip (device or module), a complete impedance matching between the transmission lines and the input/output portion can be realized, to improve the signal characteristics.

I claim:

1. A semiconductor integrated circuit apparatus comprising:

a semiconductor chip having an input/output means;

first and second terminal means connected to said input/output means; and first and second transmission lines, connected to said first and second terminal means, respectively, wherein the following formula is substantially satisfied:

$$Z = \sqrt{(L1+L2)/C1}$$

where Z is an impedance of each of said first and second transmission lines,

L1 and L2 are inductances of said first and second terminal means, and

C1 is a capacitance of said input/output means, and wherein said input/output means comprises a compensation capacitor, to substantially adjust the capacitance of said input/output means.

2. The apparatus as set forth in claim 1, wherein the inductance of said first terminal means is substantially the same as that of said second terminal means.

3. The apparatus as set forth in claim 1, wherein each of said first and second terminal means comprises:

a pad formed on said semiconductor chip and connected to said input/output means;

an external pin connected to one of said transmission lines; and a bonding wire coupled between said pad and said external pin.

4. A semiconductor integrated circuit apparatus comprising:

a semiconductor chip having an input/output means;

first and second terminal means connected to said input/output means; and first and second transmission lines, connected to said first and second terminal means, respectively, wherein the following formula is substantially satisfied:

$$Z = \sqrt{(L1+L2)/C1}$$

where Z is an impedance of each of said first and second transmission lines,

L1 and L2 are inductances of said first and second terminal means, and

C1 is a capacitance of said input/output means, and wherein said apparatus further comprises:

first and second compensation capacitors connected to said first and second terminal means, respectively, to substantially adjust the capacitance of said input/output means.

5. The apparatus as set forth in claim 4, wherein a capacitance of said first compensation capacitor is substantially the same as a capacitance of said second compensation capacitor.

6. The apparatus as set forth in claim 5, wherein the capacitance of each of said first and second compensation capacitors is twice that of said input/output means.

7. The apparatus as set forth in claim 4, wherein the inductance of said first terminal means is substantially the same as that of said second terminal means.

8. The apparatus as set forth in claim 4, wherein each of said first and second terminal means comprises:

a pad formed on said semiconductor chip and connected to said input/output means;

an external pin connected to one of said transmission lines; and a bonding wire coupled between said pad and said external pin.

9. A semiconductor integrated circuit apparatus comprising:

a semiconductor chip having an input/output means;

first and second terminal means connected to said input/output means; and first and second transmission lines, connected to said first and second terminal means, respectively, said input/output means comprising a compensation capacitor, wherein the following formula is substantially satisfied:

$$Z = \sqrt{(L1+L2)/(C1+C2)}$$

where Z is an impedance of each of said first and second transmission lines,
L1 and L2 are inductances of said first and second terminal means,
C1 is a capacitance of said input/output means, and
C2 is a capacitance of said compensation capacitor.

10. The apparatus as set forth in claim 9, wherein the inductance of said first terminal means is substantially the same as that of said second terminal means.

11. The apparatus as set forth in claim 9, wherein each of said first and second terminal means comprises:
a pad formed on said semiconductor chip and connected to said input/output means;
an external pin connected to one of said transmission, lines; and
a bonding wire coupled between said pad and said external pin.

12. A semiconductor integrated circuit apparatus comprising:
a semiconductor chip having an input/output means;
first and second terminal means connected to said input/output means; and
first and second compensation capacitors connected to said first and second terminal means, respectively;
first and second transmission lines, connected to said first and second terminal means, respectively,
wherein the following formula is substantially satisfied:

$$Z = \sqrt{(L1+L2)/(C1+C3+C4)}$$

where Z is an impedance of each of said first and second transmission lines,
L1 and L2 are inductances of said first and second terminal means,
C1 is a capacitance of said input/output means, and
C3 and C4 are capacitances of said first and second compensation capacitors.

13. The apparatus as set forth in claim 12, wherein the inductance of said first terminal means is substantially the same as that of said second terminal means.

14. The apparatus as set forth in claim 12, wherein a capacitance of said first compensation capacitor is substantially the same as a capacitance of said second compensation capacitor.

15. The apparatus as set forth in claim 14, wherein the capacitance of each of said first and second compensation capacitors is twice that of said input/output means.

16. The apparatus as set forth in claim 12, wherein each of said first and second terminal means comprises:
a pad formed on said semiconductor chip and connected to said input/output means;
an external pin connected to one of said transmission lines; and
a bonding wire coupled between said pad and said external pin.

17. An apparatus for receiving a semiconductor integrated circuit, said apparatus comprising:
a socket device having a contact means for contacting with said semiconductor integrated circuit;
first and second terminal means connected to said contact means; and
first and second transmission lines, connected to said first and second terminal means, respectively,
wherein the following formula is substantially satisfied:

$$Z = \sqrt{(L1+L2)/C1}$$

where Z is an impedance of each of said first and second transmission lines,
L1 and L2 are inductances of said first and second terminal means, and
C1 is a capacitance of said contact means, and
wherein said apparatus further comprises:
first and second compensation capacitors connected to said first and second terminal means, respectively, to substantially adjust the capacitance of said contact means.

18. The apparatus as set forth in claim 17, wherein a capacitance of said first compensation capacitor is substantially the same as a capacitance of said second composition capacitor.

19. An apparatus for receiving a semiconductor integrated circuit, said apparatus comprising:
a device having a contact means for contacting with said semiconductor integrated circuit;
first and second terminal means connected to said contact means;
first and second compensation capacitors connected to said first and said second terminal means, respectively; and
first and second transmission lines, connected to said first and second terminal means, respectively,
wherein the following formula is substantially satisfied:

$$Z = \sqrt{(L1+L2)/(C1+C3+C4)}$$

where Z is an impedance of each of said first and second transmission lines,
L1 and L2 are inductances of said first and second terminal means,
C1 is a capacitance of said contact means, and
C3 and C4 are capacitances of said first and second compensation capacitors.

* * * * *